(12) United States Patent
Zhu et al.

(10) Patent No.: US 12,328,883 B2
(45) Date of Patent: Jun. 10, 2025

(54) POLYCRYSTALLINE SEMICONDUCTOR RESISTOR

(71) Applicant: NXP USA, Inc., Austin, TX (US)

(72) Inventors: Ronghua Zhu, Chandler, AZ (US); Jan Claes, Nijmegen (NL); Xu Cheng, Chandler, AZ (US); Xin Lin, Phoenix, AZ (US); Jianhua He, Eindhoven (NL); Todd Roggenbauer, Austin, TX (US); James Gordon Boyd, Pflugerville, TX (US)

(73) Assignee: NXP USA, Inc., Austin, TX (US)

( * ) Notice: Subject to any disclaimer, the term of this patent is extended or adjusted under 35 U.S.C. 154(b) by 409 days.

(21) Appl. No.: 17/805,696

(22) Filed: Jun. 7, 2022

(65) Prior Publication Data

US 2023/0395646 A1    Dec. 7, 2023

(51) Int. Cl.
*E06B 5/10* (2006.01)
*E06B 9/06* (2006.01)
*F41H 5/24* (2006.01)
*H10D 1/47* (2025.01)

(52) U.S. Cl.
CPC ............................... *H10D 1/474* (2025.01)

(58) Field of Classification Search
CPC ... H01L 23/647; H01L 27/0802; H01L 28/20; H01L 29/16; H01L 29/8605
See application file for complete search history.

(56) References Cited

U.S. PATENT DOCUMENTS

| | | | |
|---|---|---|---|
| 6,242,314 B1 | 6/2001 | Chen et al. | |
| 6,730,554 B1 * | 5/2004 | Baldwin | H01L 28/20 438/210 |
| 6,759,729 B1 | 7/2004 | Racanelli et al. | |
| 9,825,028 B2 | 11/2017 | Van Iersel et al. | |
| 9,991,120 B2 | 6/2018 | Montgomery et al. | |
| 11,257,675 B2 | 2/2022 | Fang et al. | |
| 2008/0217741 A1 * | 9/2008 | Young | H01L 29/8605 257/E29.326 |
| 2013/0001704 A1 * | 1/2013 | Wang | H01L 28/20 257/379 |
| 2014/0008765 A1 | 1/2014 | Choi | |
| 2017/0005043 A1 | 1/2017 | Pagani et al. | |
| 2020/0013769 A1 | 1/2020 | Yanagawa et al. | |
| 2020/0279905 A1 | 9/2020 | Nandakumar et al. | |

* cited by examiner

*Primary Examiner* — John A Bodnar
(74) *Attorney, Agent, or Firm* — David G. Dolezal

(57) ABSTRACT

In one embodiment, a semiconductor die includes a polycrystalline semiconductor resistor structure (poly resistor structure). The poly resistor structure includes a resistive path between a first terminal and a second terminal. The poly resistor structure includes a first region having a net first conductivity type dopant concentration located in the resistance path and a second region having a net second conductivity type dopant concentration located in the resistance path. A silicide structure is located on both a first portion of the first region and a first portion of the second region to electrically connect the first portion of the first region and the first portion of the second region. In some embodiments, poly resistor structures with different conductivity type regions can be connected together.

20 Claims, 8 Drawing Sheets

POLYCRYSTALLINE SEMICONDUCTOR RESISTOR

BACKGROUND OF THE INVENTION

Field of the Invention

This invention relates in general to a polycrystalline semiconductor resistor for a semiconductor die.

Background

Some semiconductor die (e.g., integrated circuits) include resistors that are used in circuits. One type of resistor is a polycrystalline semiconductor resistor (poly resistor) such as e.g., a poly silicon resistor with a specified conductivity dopant concentration to provide the desired resistivity for the given shape of the poly silicon resistor structure.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein, a semiconductor die includes a polycrystalline semiconductor resistor structure (poly resistor structure). The poly resistor structure includes a resistive path between a first terminal and a second terminal. The poly resistor structure includes a first region having a net first conductivity type dopant concentration located in the resistance path and a second region having a net second conductivity type dopant concentration located in the resistance path. A silicide structure is located on both a first portion of the first region and a first portion of the second region to electrically connect the first portion of the first region and the first portion of the second region. The first region and the second region includes portions that are not silicided.

Packaging materials and packaging configurations may cause package induced stress on a semiconductor die that is implemented in a semiconductor die package. With some semiconductor die, the resistance at a given temperature (the temperature coefficient) of a poly resistor may shift as a result of the package induced stressed. Such a shift in the temperature coefficient may affect the operation of a circuit in which the resistor is implemented. This may be especially problematic in analog circuits where resistor precision is very important to proper circuit operation.

N-type regions and P-type regions of poly resistors may have properties that are oppositely affected by a stress vector such as from packaging induced stress. For example, N-type poly regions and P-type poly regions may have opposite piezo-resistance coefficients including for strain in parallel and perpendicular directions. Thus, a stress vector in one direction may increase the resistance value in a P-type region and decrease the resistance value in an N-type region.

Providing a poly crystalline resistor structure that includes regions having different net conductivity dopant types may provide for a polycrystalline resistor that can have properties that can counterbalance the changes in resistivity that occurs from stress such as packaged induced stress. For example, a poly resistor structure may be designed such that the resistance of an N-type region of a poly resistor may change in one direction due to a stress vector whereas the resistance of the P-type region of the poly resistor may change in the opposite direction due to the stress vector. According, utilizing polycrystalline resistors with different conductivity regions may provide for a resistor that has a reduced variation in resistivity due to package induced stress. Providing a resistor with reduce resistivity variation may lead to better circuit performance, especially for analog circuits.

Figure 1:
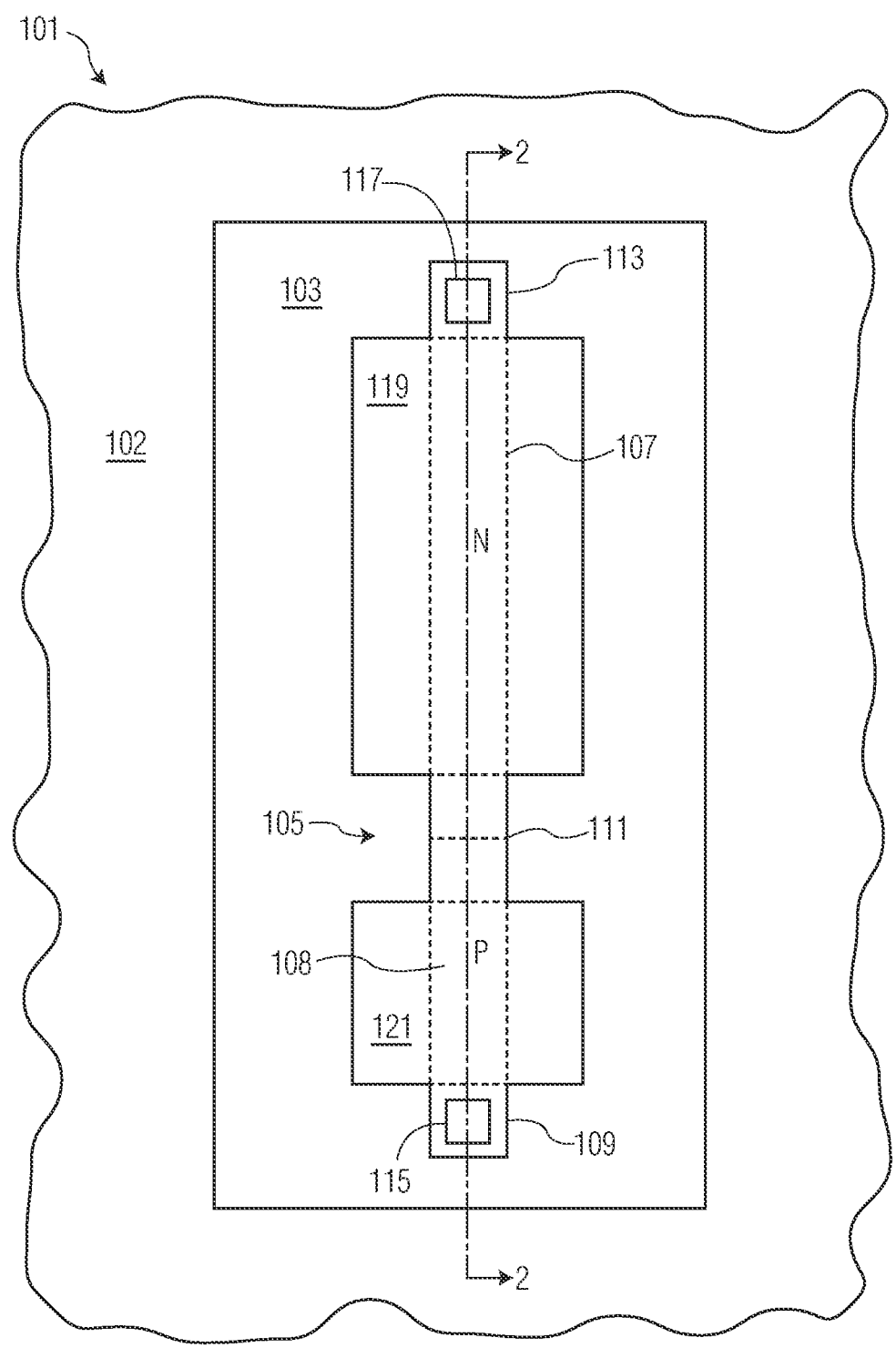
FIG. 1 sets forth a partial top view of a semiconductor die at one stage in its manufacture according to one embodiment of the present invention.
Figure 2:
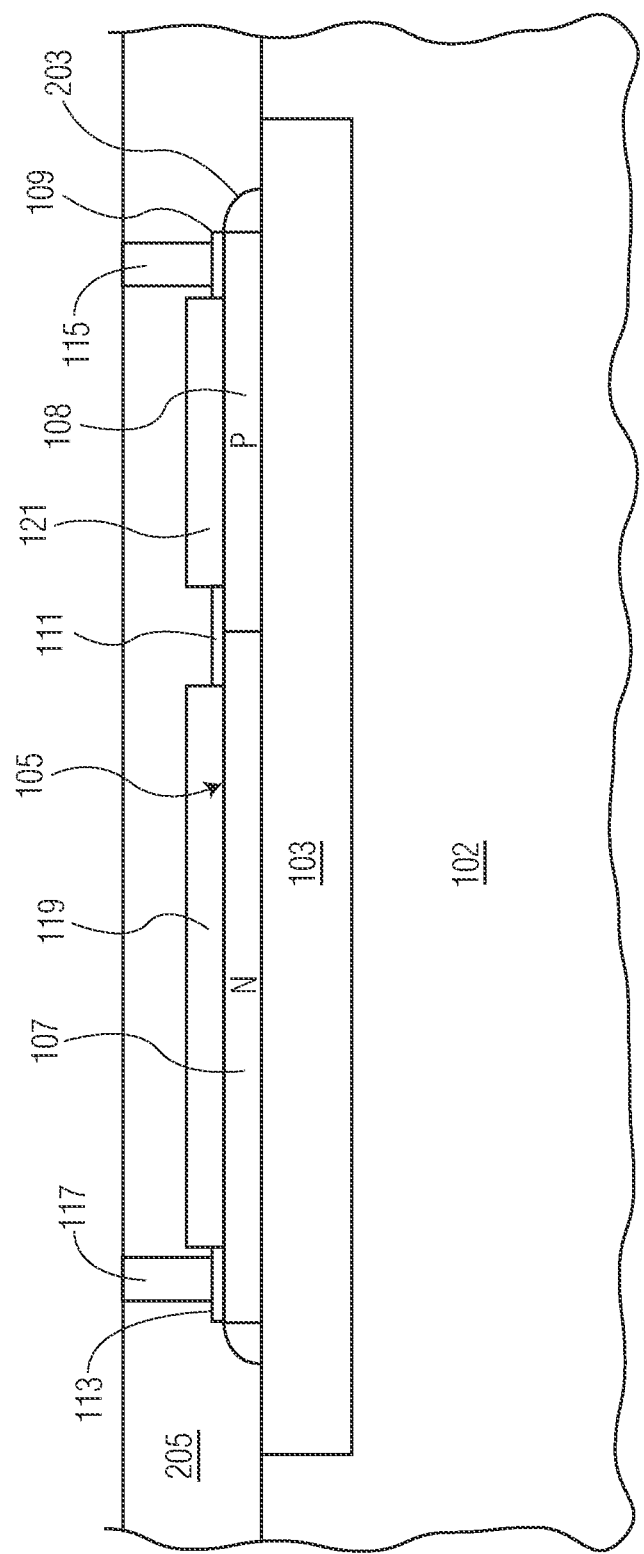
FIG. 2 sets forth a partial cutaway side view of the semiconductor die of FIG. 1 according to an embodiment of the present invention.

FIG. 1 is a partial top view and FIG. 2 is a partial side cutaway view of a semiconductor die at a stage in its manufacture according to one embodiment of the present invention. For ease of illustration, the top view of FIG. 1 does not show side wall spacer 203 and interlayer dielectric 205 as shown in FIG. 2.

As shown in FIGS. 1 and 2, a semiconductor die 101 includes a semiconductor substrate 102 with a shallow trench isolation structure (STI) 103 of dielectric material (e.g., oxide) selectively formed therein. In the embodiment shown, substrate 102 is a bulk semiconductor substrate that includes a monocrystalline semiconductor material (e.g., silicon, silicon germanium, gallium nitride, another III-V semiconductor material, or another semiconductor material). In other embodiments, substrate 102 may include multiple layers of different semiconductor materials and/or regions doped with conductivity dopants of different types and at different concentrations. In some embodiments, some of the semiconductor material of substate 102 may be epitaxially grown. In some embodiments, substrate 102 may have a semiconductor on insulator (SOI) configuration and/or include other isolation structures such a buried oxide layer of deep isolation trenches (none shown). Also in other embodiments, die 101 may have other semiconductor devices such as transistors and diodes (not shown) for implementing circuits of the semiconductor device.

In the embodiment shown, die 101 includes a polycrystalline resistor 105 located on top of STI 103. In other embodiments, resistor 105 may be located on other types of structures of die 101 e.g., such as a gate dielectric. In one embodiment, polycrystalline resistor 105 is made of poly silicon and is formed by photolithographic patterning a layer of poly silicon material formed over a wafer containing semiconductor die 101. Resistor 105 includes a resistive path from one terminal to another. In the embodiment shown, the terminals are implemented by silicide structures 113 and 109 formed on the end portions of resistor 105. However, a terminal for a resistor may be implemented with other conductive structures in other embodiments (e.g., a gate of a transistor).

In the embodiment shown, resistor 105 includes region 107 having a net N conductivity type dopant concentration and region 108 having a net P conductivity type dopant concentration. In one embodiment, these regions are doped by selectively implanting through a mask (not shown), N type conductivity dopants (e.g., arsenic, phosphorous) or P type conductivity dopants (e.g., boron) into regions of resistor 105. However, in other embodiments, at least some of the dopants may be formed in-situ or by blanket deposition. In the Figures, an "N" designation on a region indicates that it has a net N type dopant concentration (N region) and a "P" designates that the region has a net P type dopant concentration (P region).

In one embodiment, a P region (e.g., region 108) of a poly resistor has a net P-type doping concentration in the range of 1E19 to 1E21 per $cm^3$, but the net doping concentration may be of other levels in other embodiments. In one embodiment, an N region (e.g., region 107) of a poly resistor has a net N-type doping concentration in the range of 1E19 to 1E21 per $cm^3$, but the net doping concentration may be of other levels in other embodiments. The net doping concentration of a region may be specified to provide a desired resistivity for a resistor based on the shape of the resistor.

In some embodiments, the poly crystalline layer that is patterned to form resistor 105 may also be patterned to form other poly crystalline structures of a die such as gate structures for field effect transistors or capacitor electrodes.

After the patterning of the poly crystalline layer to form resistor 105, a layer of silicide blocking material (e.g., an oxide and nitride stack or oxide only) is formed on the wafer of die 101 and is patterned (as shown in the top view of FIG. 1) to form silicide blocking structure 119 that is located over region 107 and silicide blocking structure 121 that is located over region 108. These blocking structures prevent the formation of silicide on the portions of regions 107 and 108 on which they are located. The blocking material is anisotropically etch such that a spacer 203 of blocking material is formed on the sidewall of resistor 105.

After the formation of blocking structures 119 and 121, silicide structure 113 is formed on a portion of region 107, silicide structure 109 is formed on a portion of region 108, and silicide structure 111 is formed on a portion of region 107 and a portion of region 108. In one embodiment, silicide structures 109, 111, and 113, are formed by depositing a layer of metal (e.g., cobalt, titanium) on the wafer of die 101 and annealing the wafer at a high temperature where the metal reacts with the silicon of resistor 105 to form a silicide. The unreacted metal is then removed.

After the formation of silicide structures 109, 111, and 113, interlayer dielectric 205 is formed on the wafer of die 101. In one embodiment, dielectric 205 is formed by one of more layers of dielectric material. Openings are formed in dielectric 205 to expose silicide structures 113 and 109. The openings are filled with metal (e.g., titanium, titanium nitride, copper, and/or tungsten) to form contact 117 that electrically contacts silicide structure 113 and contact 115 that electrically contacts silicide structure 109.

Silicide structure 111 electrically connects region 107 to region 108 to provide a conductive path between the two regions. Without silicide structure 111, a sufficient amount of current would not flow between region 107 and region 108 due to the diode created by the interface between N region 107 and P region 108. Silicide structure 111 allows for poly resistor 105 to include two adjacent regions of opposite conductivity types in series and still provide a resistance path of a desired resistance between two terminals (silicide structures 113 and 109 in the embodiment shown). Structure 111 is not electrically contacted by a contact structure like contacts 117 and 115.

In one embodiment, the ratio of the length of N region 107 to the length of P region 108 is set based upon the change in temperature coefficients of the regions in response to stress vectors such that the overall change in terminal to terminal resistance in response to the stress vectors are minimized. For example, a stress vector may have a greater effect on the temperature coefficient of the material of P region 108 in a first direction than on the material of N region 107 in the opposite direction. Accordingly, the length of region 107 is made longer so that the effect can be relatively equalized to provide a relatively constant resistance over a range of applied stress. In one embodiment, the ratio of the volume of N region 107 to the P region 108 is between 1.1:1 to 5:1.

After the stage shown in FIGS. 1 and 2, additional interconnects are formed in one or more metal interconnect layers over dielectric 205 to electrically couple contacts 117 and 115 to other contacts of other device on die 101 and/or to external conductive terminals (e.g., bond pads, bond posts, bumps) formed on the top surface of a wafer during fabrication to implement resistor 105 in a circuit on die 101 or off die 101 in some embodiments. Afterwards, the wafer is separated into multiple semiconductor die (like die 101), each including a poly resistor similar to resistor 105. The semiconductor die may be packaged into packages that are implemented in electronic systems. The method for forming a semiconductor die may include other conventional processes not described herein such as e.g., cleaning, annealing, and passivation operations.

Figure 3:
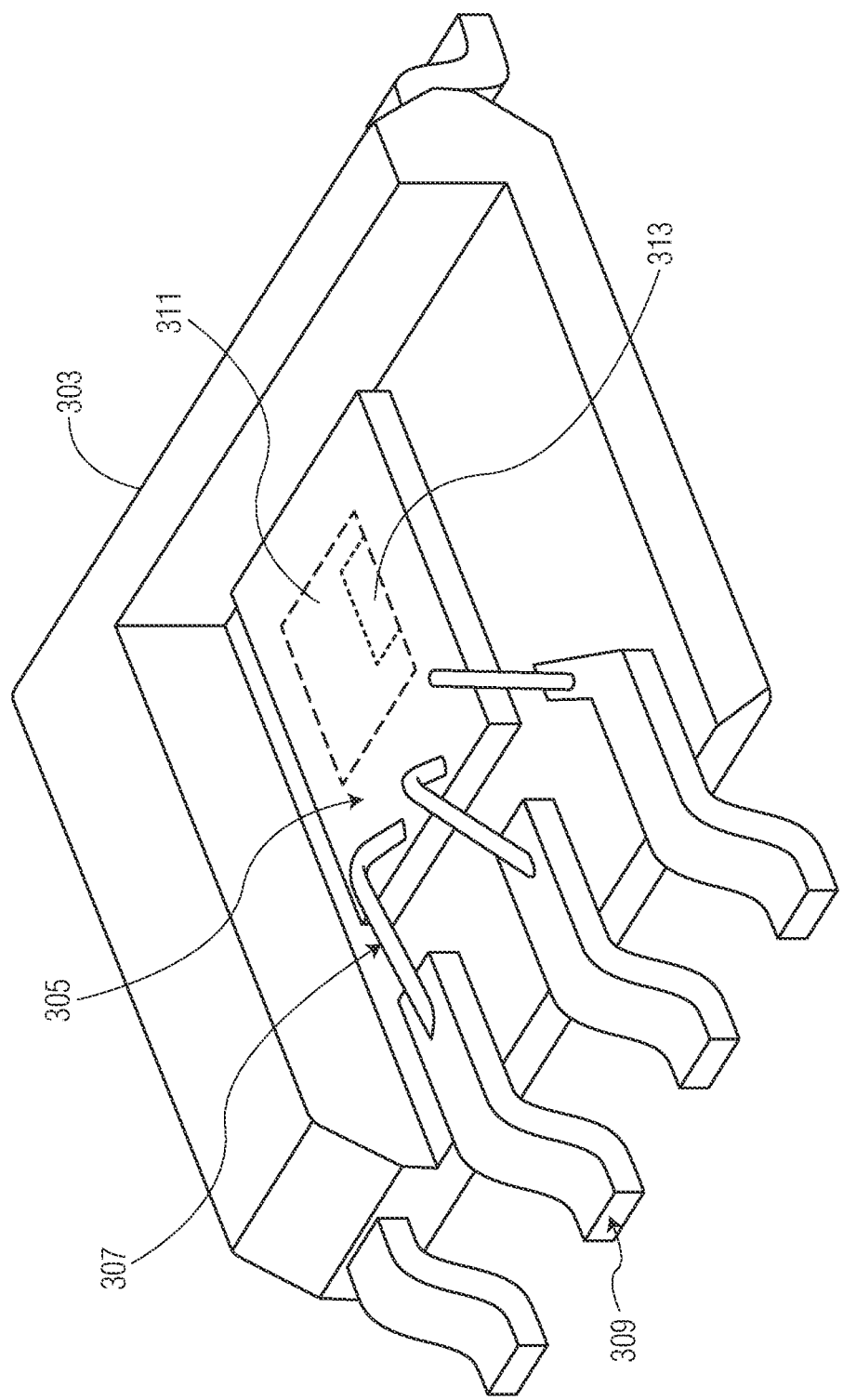
FIG. 3 sets forth a cutaway perspective view of a packaged semiconductor die according to one embodiment of the present invention.

FIG. 3 shows a cutaway perspective view of a semiconductor package 301 that includes a poly resistor on a semiconductor die 305 according to one embodiment of the present invention. Semiconductor die 305 is an integrated circuit that includes an analog circuit 311 with a poly resistor 313 (which may be similar to resistor 105) having different conductivity regions (not shown in FIG. 3). Die 305 includes pads that are wire bonded (e.g., with wire 307) to leads (e.g., 309) of a lead frame. Die 305, wires (307), and a portion of the leads (309) are encapsulated in a mold compound 303 (a portion of which is not shown in FIG. 3 for the viewing of die 305). Mold compound 303 may provide a package induced stress on die 305 that affects the resistivity of resistor 313. Because resistor 313 includes regions of different conductivity types in a resistance path, the packaged induced stress may affect the temperature coefficients of the regions in opposite directions, thereby counterbalancing the effects of the stress in resistor 313.

In one example, analog circuit 311 is a voltage regulator where resistor 313 is designed to provide a specific resistance for providing a desired reference voltage. If the packaged induced stress from mold compound 303 were not counter balanced by the different conductivity type regions of resistor 313, then the change in resistance due to package induced stress may cause the reference voltage to be out of specification, thereby affecting the operation of analog circuit 311. In another example, analog circuit 311 is a feedback oscillator where a free running oscillator is locked to an on-chip circuit providing an RC time constant. The frequency of the oscillator is dependent on the characteristics of a resistance element and capacitance element providing the RC time constant. Typically, a capacitor is normally stable with respect to package induced stress. Therefore, resistor stability with respect to package induced stress is important for frequency accuracy. In other embodiments, a poly resistor with different conductivity type regions may be implemented in other types of circuits such as sensors, drivers, oscillators, filters, A/D or D/A converters, memory, I/O, digital logic, power supply etc. Also in other embodiments, a semiconductor die may be packaged in other types of packages. In addition, a poly resistor may be implemented in one die in a package and connected to a circuit in a second die of a package, or connected to a circuit in another package.

Figure 4:
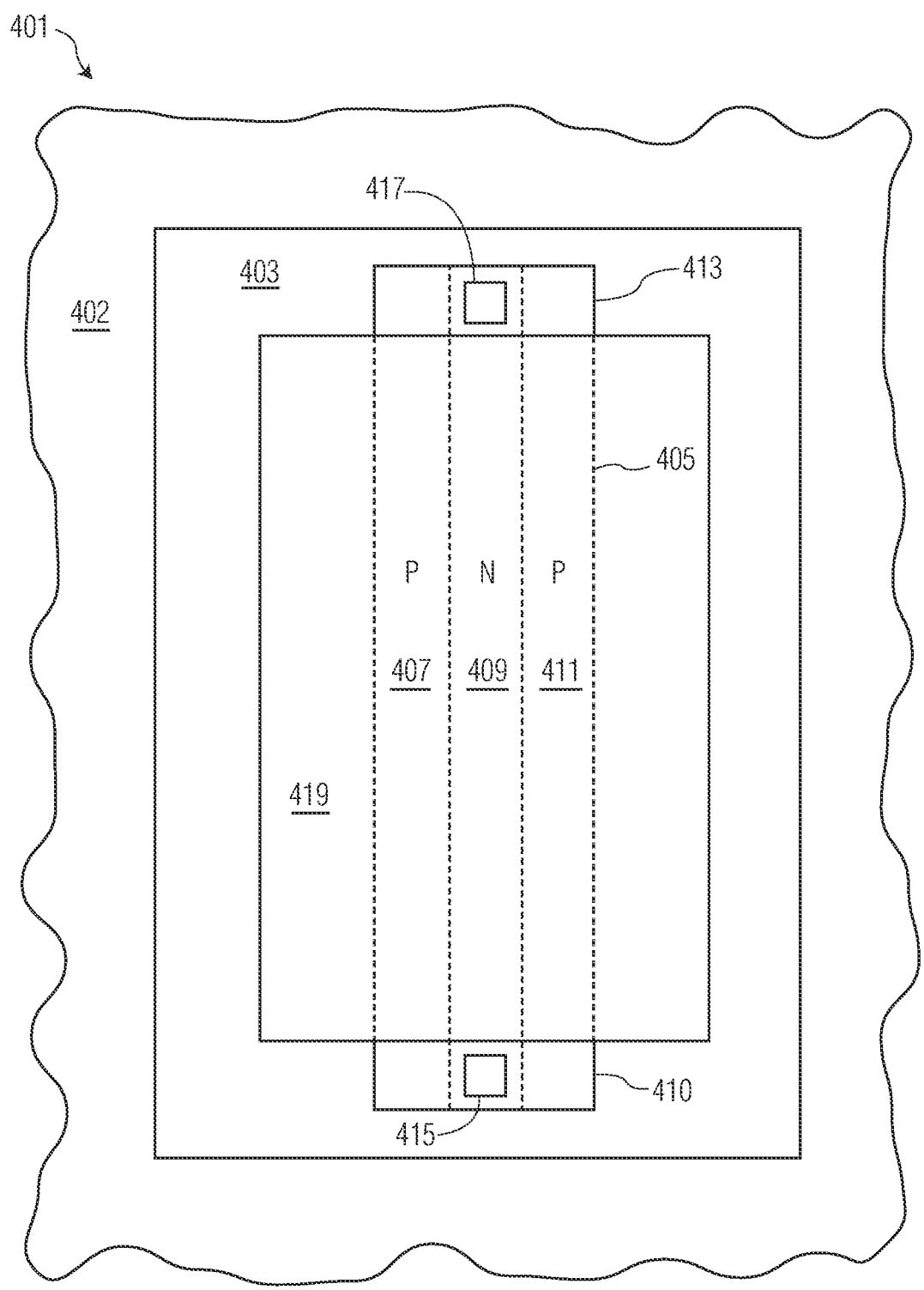
FIG. 4 sets forth a partial top view of a semiconductor die at one stage in its manufacture according to another embodiment of the present invention.

FIG. 4 is a partial top view of a semiconductor die 401 according to another embodiment. Semiconductor die 401 includes a semiconductor substrate 402 (similar to substrate 102) and a poly resistor 405 located over an isolation structure 403 (similar to STI 103). Poly resistor 405 includes regions 407 and 411 that have a net P type conductivity dopant concentration and region 409 that has a net N type conductivity dopant concentration. The end portions of regions 407, 409, and 411 are silicided with silicide structure 413 and silicide structure 410. Contact 417 is in electrical contact with silicide structure 413, and contact 415 is in electrical contact with silicide structure 410. Silicide structure 413 electrically connects regions 407, 409, and 411 to each other and to contact 417. Silicide structure 410 electrically connects regions 407, 409, and 411 to each other and to contact 415. Blocking material 419 is located over portions of resistor 405 preventing silicide from being formed thereon.

The resistance path of resistor 405 between silicide structures 410 and 413 includes regions 407, 409, and 411 connected in parallel. Regions 407, 409, and 411 have a sufficient doping concentration to provide a desired resistance between silicide structure 413 and silicide structure 410.

With P regions 407 and 411 arranged in parallel with N region 409, package induced stress that affects the temperature coefficient of N region 409 in one direction may affect the temperature coefficient of P regions 407 and 411 in the opposite direction. Accordingly, by setting the doping concentrations of each region and setting the ratio of the cross sectional area of region 409 with respect to the combined cross sectional areas of regions 407 and 411, the variance of resistivity in response to a stress can be reduced. In some embodiments, resistor 405 may only include one P region running between silicide structures 410 and 413. Other embodiments may also include multiple N regions connected in parallel with the one or more P regions.

Figure 5:
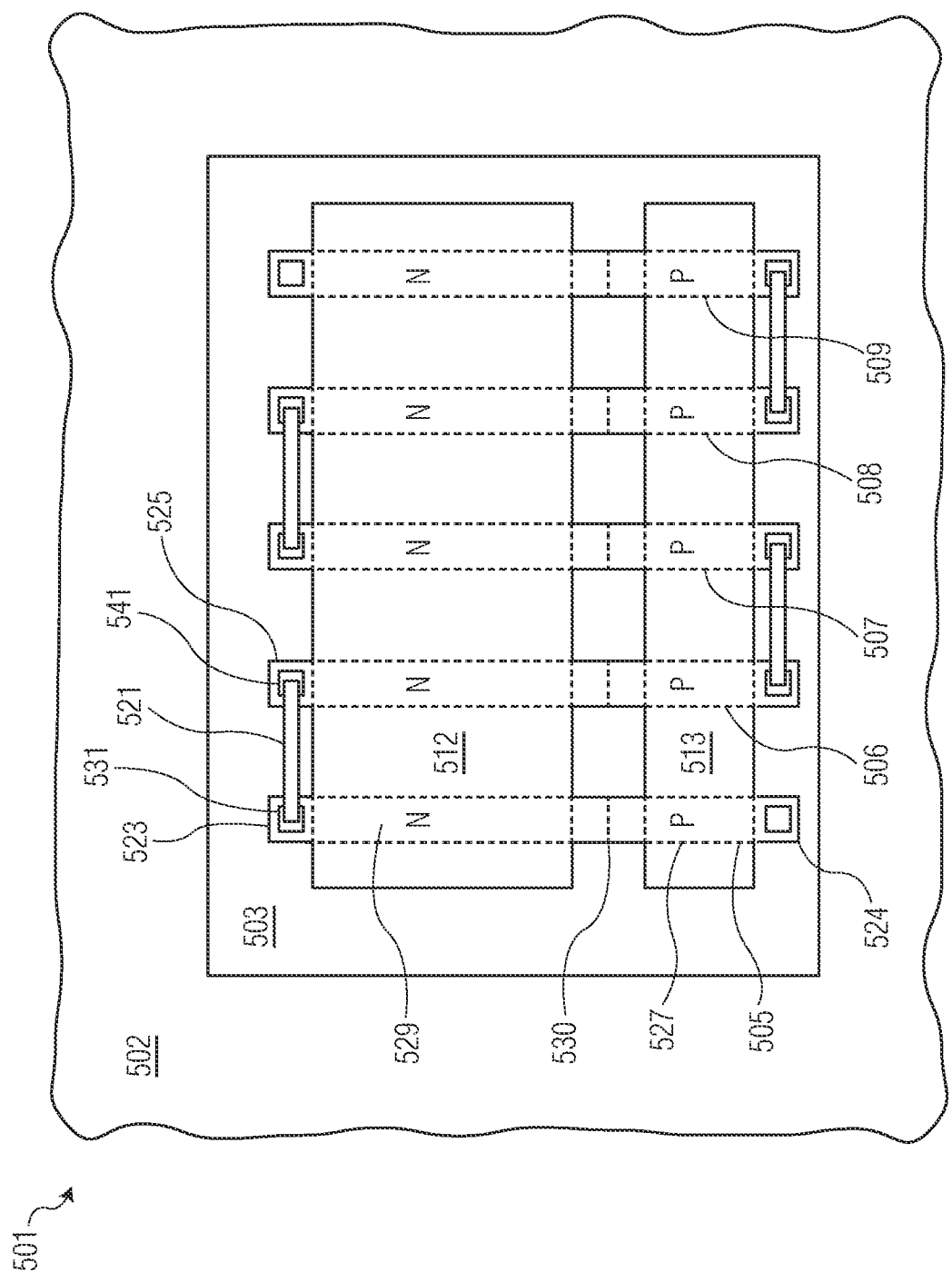
FIG. 5 sets forth a partial top view of a semiconductor die at one stage in its manufacture according to another embodiment of the present invention.

FIG. 5 is a top partial view of a semiconductor die 501 according to another embodiment. Semiconductor die 501 includes a semiconductor substrate 502 (similar to substrate 102). FIG. 5 includes a number of a poly resistors 505-509 located over an isolation structure 403, similar to STI 103. In the embodiment shown, each of the poly resistors 505-509 is similar to poly resistor 105 and includes a region (529) that has a net N type conductivity dopant concentration and a region (527) that has a net P type conductivity dopant concentration. The end portions of the N regions and P regions for each poly resistor (505-509) are silicided with silicide structures (523,524). The poly resistors 505-509 also include a silicide region (530) that electrically connects the N region (529) to the P region (527). Blocking material structures 512 and 513 are located over portions of poly resistors 505-509 preventing silicide from being formed on those portions.

In the embodiment shown, poly resistors 505-509 are oriented in a parallel orientation in a daisy chained configuration where upper level interconnects (521) electrically connect contacts (531, 541) that are in electrical contact with end silicide structures (523, 525) of a poly resistor to provide a resistive element with the desired resistive value. Utilizing a poly resistor with two different doped regions may provide for a multi-resistor resistive element that has a reduced variance to package induced stress.

In other embodiments, poly resistors 505-509 may be alternatively oriented in opposite directions to provide further resilience to package induced stress. For example, resistors 506 and 508 may be flipped to where the P region is located at the top relative to the view of FIG. 5 and the N region is located at the bottom relative to the view of FIG. 5. In other embodiments, some of poly resistors 505-509 may have only a net N type doping concentration and others of poly resistors 505-509 have only a net P type doping concentration to reduce the effects on resistance of packaged induced stress or temperature variation. In some of these embodiments, the ratio of resistors with only an N region to resistors having only a P region is in the range of 1.1:1 to 5:1 for embodiments where the resistors are of the same shape.

Figure 6:
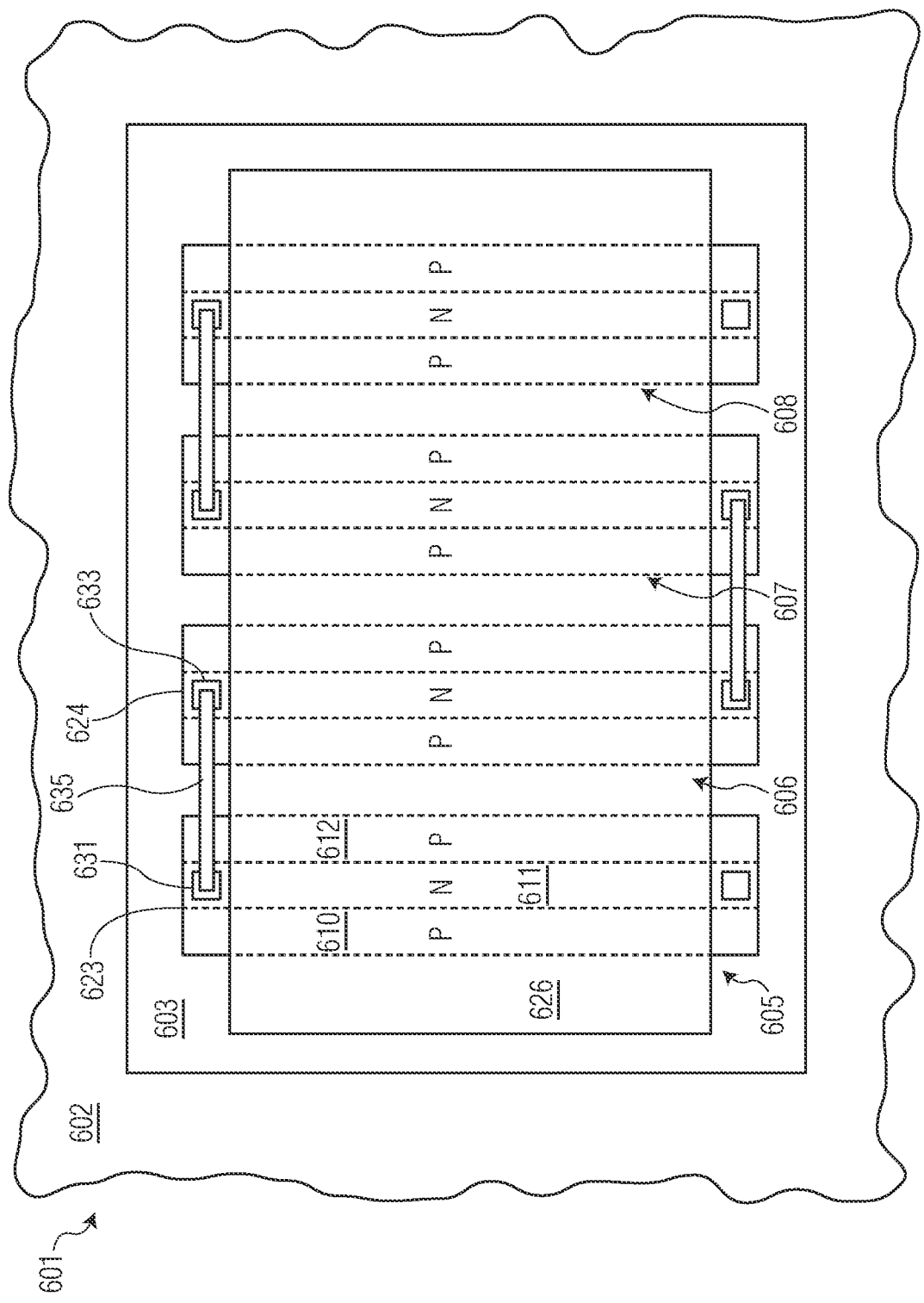
FIG. 6 sets forth a partial top view of a semiconductor die at one stage in its manufacture according to another embodiment of the present invention.

FIG. 6 is a top partial view of a semiconductor die 601 according to another embodiment. Semiconductor die 601 includes a semiconductor substrate 602 (similar to substrate 102). FIG. 6 includes a number of poly resistors 605-608 located over an isolation structure 603, similar to STI 103. Each of poly resistors 605-608 is similar to poly resistor 405 (shown in FIG. 4) and includes two regions (610, 612) that have a net P type conductivity dopant concentration and a region (611) that has a net N type conductivity dopant concentration. The end portions of each poly resistor (605-608) are silicided with silicide structures (623,624). Blocking material 626 is located over portions of the poly resistors 605-608 preventing silicide from being formed on those portions.

In the embodiment shown, poly resistors 605-608 are in a parallel orientation in a daisy chained configuration where upper level interconnects (635) electrically connect contacts (631,633) that are in electrical contact with end silicide structures (623,624) of a poly resistor to provide a resistive element with the desired resistive value. Utilizing poly resistors with different doped regions in parallel may provide for a resistive element that has a reduced variance to package induced stress.

Figure 7:
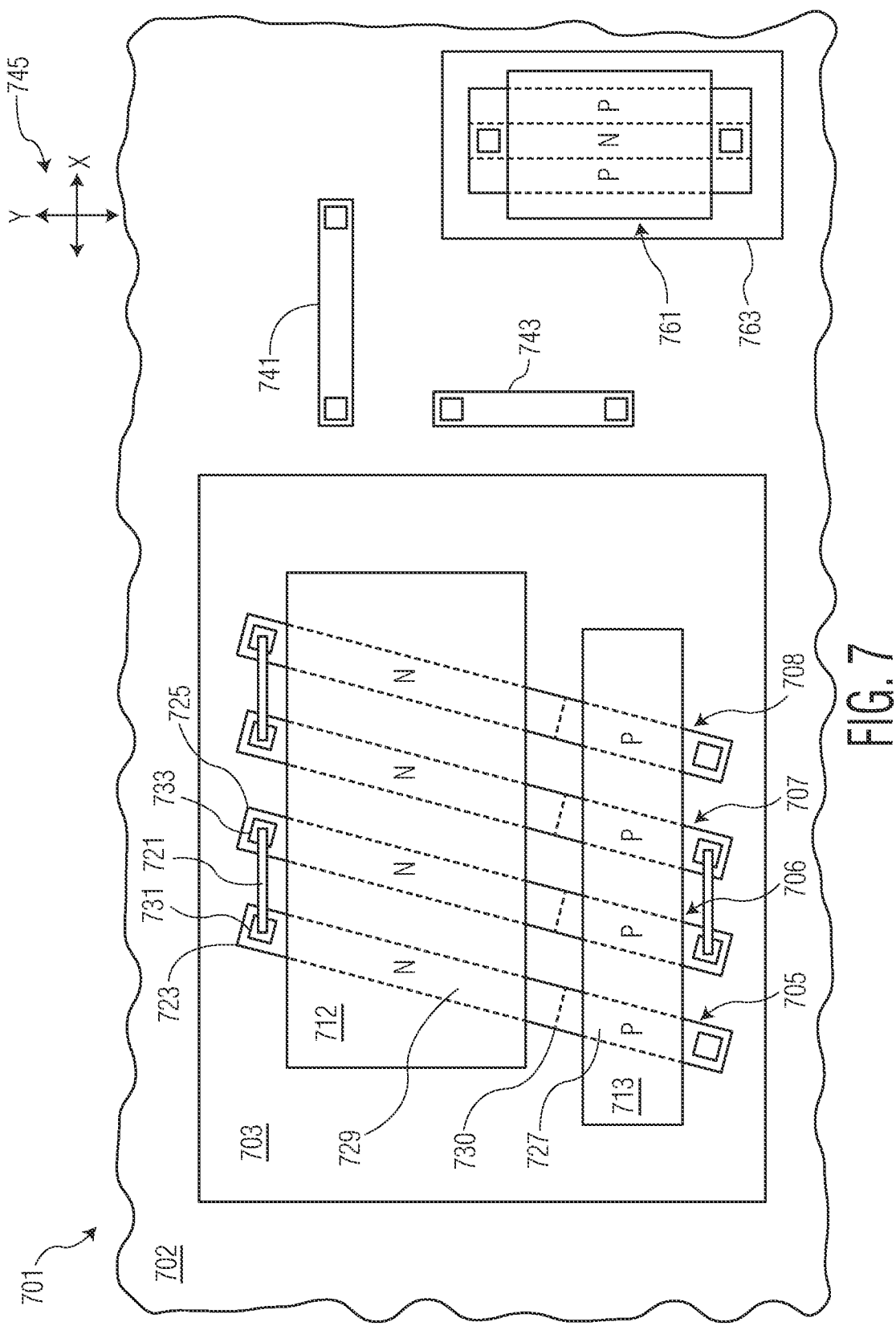
FIG. 7 sets forth a partial top view of a semiconductor die at one stage in its manufacture according to another embodiment of the present invention.

FIG. 7 is a partial top view of a semiconductor die 701 according to another embodiment. Semiconductor die 701 includes a semiconductor substrate 702 (similar to substrate 102). FIG. 7 includes a number of a poly resistors 705-708 located over an isolation structure 703, which is similar to STI 103. Each of the poly resistors 705-708 is similar to poly resistor 105 and includes a region (729) that has a net N type conductivity dopant concentration and a region (727) that has a net P type conductivity dopant concentration. The end portions of the N regions and P regions for each poly resistor (705-708) are silicided with silicide structures (723,724). The poly resistors 705-708 also include a silicide region (730) that electrically connects the N region (729) to the P region (727) of the resistor. Blocking material structures 712 and 713 are located over portions of the poly resistors 705-708 preventing silicide from being formed on those portions.

Semiconductor die 701 includes other circuitry. Polycrystalline structures 741 and 743 are utilized for other semiconductor devices e.g., as gates for transistors (not shown) having their source and drain regions located in substrate 102. Structures 741 and 743 are elongated in two different directions with structure 741 elongated in the X lateral substrate direction (see arrows 745) and structure 743 in the Y lateral substrate direction. Both the X and Y directions are parallel with a major planar surface of substrate 702. Although not shown, die 701 may include other poly crystalline structures located above substrate 702 where the poly crystalline structures have elongated portions in the X and Y directions.

In the embodiment shown, poly resistors 705-708 are oriented in a parallel orientation in a daisy chained configuration where upper level interconnects (721) electrically connect contacts (731, 733) that are in electrical contact with end silicide structures (723,725) of a poly resistor to provide a resistive element with the desired resistive value. As shown in FIG. 7, resistors 705-708 are elongated in direction that is laterally offset from the X and Y lateral substrate directions by angles e.g., in the range of 30-60 degrees from the X lateral substrate direction or the Y lateral substrate direction. Although they may be offset at other angles (e.g., 80-10 degrees) from the X and Y directions. In one embodiment, the offset angle is other than 45 degrees from the X or Y directions.

In some embodiments, orienting poly resistors at angles (e.g., 10-80 degrees) offset from the direction of the other poly structures of a semiconductor die (e.g., the X and Y lateral substrate direction) may reduce the effects of packaged induced stress on the resistivity of the resistors. In some embodiments, the piezo-resistance coefficients of a poly resistor typically have a different polarity along the X and Y lateral substrate directions. By orientating the resistor at a certain angle, the differences in the polarity coefficients between the X and Y lateral substrate directions may cancel each other out in response to package induced stress.

Die 701 also includes a resistor 761 located on an isolation structure 763. Resistor 761 is similar to resistor 405 where it includes P regions in parallel with an N region.

In other embodiments similar to FIG. 7, the poly resistors 706 and 708 may have an opposing orientation where the P region would be located at the upper right portion and the N region at the lower left portion (relative to the view of FIG. 7). Also in other embodiments, poly resistors similar to poly resistor 405 of FIG. 4 may be used in place of poly resistors 705-708. In still other embodiments, some of poly resistors 705-708 may be entirely doped with N type conductivity dopants and the others would be entirely doped with P type dopants so as to reduce the effects of packaging induced stress on the resistance of the resistor element of FIG. 7. With at least some of these embodiments, the ratio of the total volume of the unsilicided portions of the N regions of the resistive element to the total volume of the unsilicided portions of the P regions of the resistive element would be in the range of 1.1:1 to 5:1.

Figure 8:
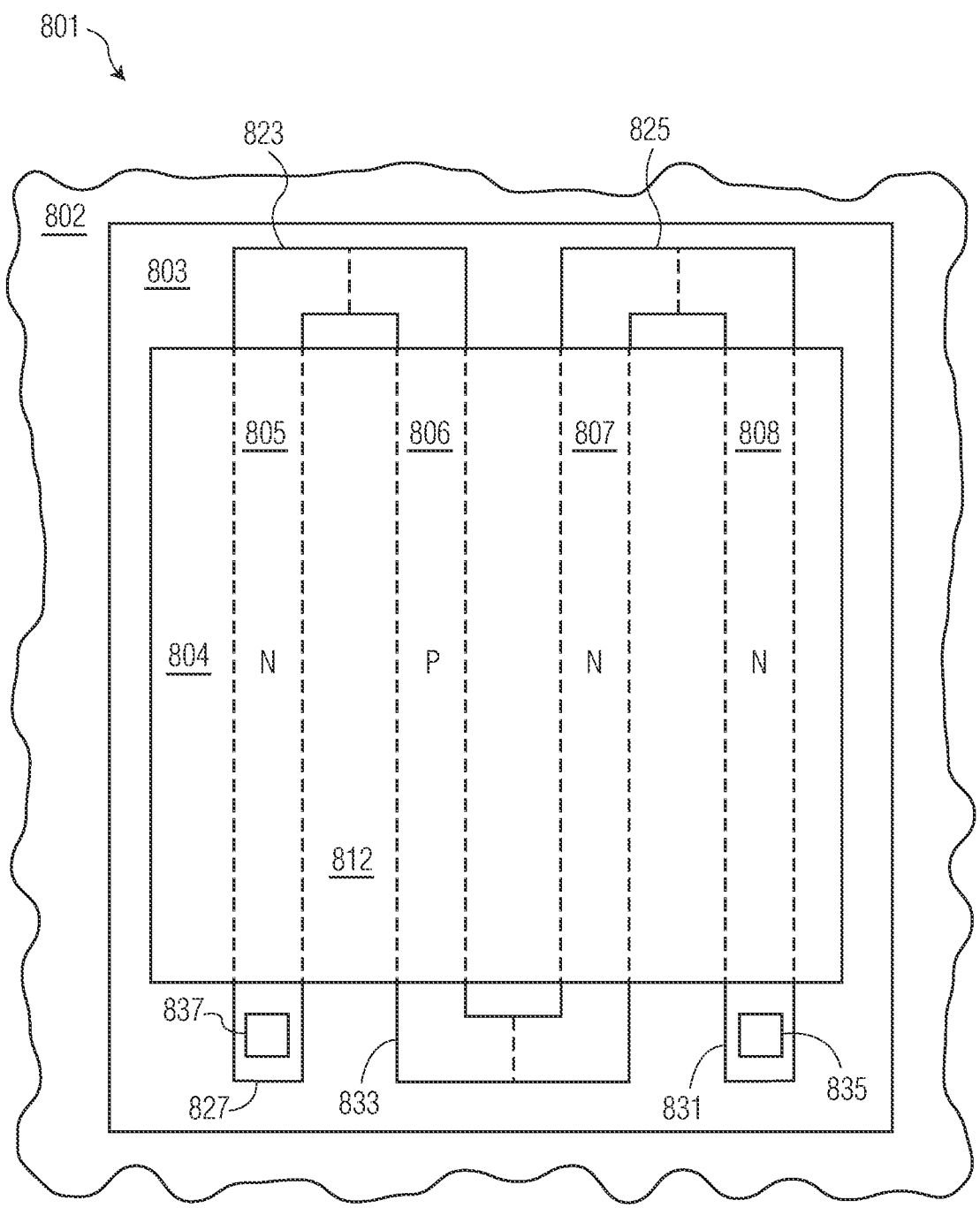
FIG. 8 sets forth a partial top view of a semiconductor die at one stage in its manufacture according to another embodiment of the present invention.

FIG. 8 is a partial top view of a semiconductor die 801 according to another embodiment. Semiconductor die 801 includes a semiconductor substrate 802 (similar to substrate 102). Die 801 includes a poly silicon resistor 804 located over an isolation structure 803 (similar to STI 103). In FIG. 8, resistor 804 has a serpentine configuration with regions 805 and 807 having a net N type conductivity doping concentration and regions 806 and 808 having a net P type conductivity doping concentration. Die 801 includes a silicide blocker 812 that prevents portions of regions 805-808 from being silicided.

Outside of blocker 812, silicide structures (823, 825, and 833) are located over the portions of resistor 804 where the N regions (805, 807) abut with the P regions (806, 808). These silicide structures act to electrically connect the different conductivity type regions so as to enable a resistive path from terminal silicide structure 827 to terminal silicide structure 831. Die 801 includes contact 837 electrically contacting silicide structure 827 and contact 835 electrically contacting silicide structure 831. Contacts 837 and 835 may be electrically connected to other circuitry (not shown) of die 801 through upper level interconnects subsequently formed on die 801 (not shown).

With resistor 804, the width, length, doping concentrations, and ratio of N type regions to P type regions can be adjusted to provide a desired resistance and to minimize the effects of the packaged induce stress to provide a constant resistance value over a range of stress conditions. For example, in FIG. 8, one region (e.g., 806) may be a P-type region and the other three regions (805, 807, and 808) may be an N-type region.

One advantage of resistor 804 is that it allows for multiple different conductivity type doped regions to be electrically connected together by silicide structures to provide a serial resistive path without having to use interconnect structures (e.g., 521 of FIG. 5) to connect the differently doped regions. This may allow for the routing of other interconnects (not shown) above those areas. Another advantage of resistor 804 is that because the transition boundaries between the different conductivity regions are located under a silicided region, the doping boundaries between the N and P regions do not have to be precise. The boundary could be misaligned or there could be a region of undoped poly silicon between the N region and P region. With resistor 804, the resistance of a region is defined by the length of blocking structure 812 and not be the accuracy of the boundaries of the P and N type doping regions.

In other embodiments, resistor 804 may have a different number of regions and have a different ratio of N regions versus P regions. Furthermore, the spacings between the regions may be reduced.

As disclosed herein, a first structure is "directly over" or "directly above" a second structure if the first structure is located over the second structure in a line having a direction that is perpendicular with the generally planar major side of the wafer or substrate. For example, in FIG. 2, blocking structure 119 is directly over STI 103. Contact 117 is not directly over region 108. As disclosed herein, a first structure is "directly beneath" or "directly below" a second structure if the first structure is located beneath the second structure in a line having a direction that is perpendicular with the generally planar major side of the wafer or substrate. For example, in FIG. 2, STI 103 is directly beneath contact 117. Silicide structure 111 is not directly beneath contact 117. One structure is "directly between" two other structures in a line if the two structures are located on opposite sides of the one structure in the line. For example, in FIG. 2, blocking structure 119 is located directly between contact 117 and contact 115 in a line in the cut away side view of FIG. 2. "Directly laterally between" means that the line is a lateral line. A "lateral line" is a line that is parallel with a generally planar major side of the wafer or substrate. In FIG. 2, blocking structures 119 and 121 are located in a lateral line. Contact 115 and region 107 are not located in a lateral line.

As disclosed herein, a first structure is directly laterally surrounding a second structure if a portion of the first structure surrounds the second structure in a plane that is parallel with a generally planar major side of the wafer or substrate (a lateral plane). As disclosed herein, a first structure is "laterally separated" from a second structure if there is separation between the two structures in a line that is parallel with a generally planar major side of the wafer or substrate. For example, in FIG. 2, blocking structures 119 and 121 are laterally separated from each other. As disclosed herein, a "lateral distance" is the distance in a direction that is parallel with a generally planar major side of the wafer or substrate. As disclosed herein, a "vertical distance" is the distance in a direction that is perpendicular with a generally planar major side of the wafer or substrate.

Features shown or described herein with respect to one embodiment may be implemented in other embodiments shown or described herein.

A semiconductor die includes a polycrystalline semiconductor resistor structure including a resistance path between a first terminal and a second terminal. The polycrystalline semiconductor resistor structure includes a first region having a net first conductivity type dopant concentration located in the resistance path and a second region having a net second conductivity type dopant concentration located in the resistance path. The second conductivity type is opposite the first conductivity type. The semiconductor die includes a silicide structure located on both a first portion of the first region and a first portion of the second region to electrically connect the first portion of the first region and the first portion of the second region. The first region includes a second portion that is not silicided and the second region includes a second portion that is not silicided.

In another embodiment, a semiconductor die includes a first polycrystalline semiconductor resistor structure including a resistance path between a first terminal and a second terminal. The first polycrystalline semiconductor resistor structure including a first region having a net first conductivity type dopant concentration located in the resistance path. The first polycrystalline semiconductor resistor structure includes a portion that includes the first region having an elongated form extending in a first lateral direction. The semiconductor die including a second polycrystalline semiconductor resistor structure including a resistance path of between a first terminal and a second terminal of the second polycrystalline semiconductor resistor structure. The second polycrystalline semiconductor resistor structure including a second region having a net second conductivity type dopant concentration located in resistance path. The second conductivity type is opposite the first conductivity type. The second polycrystalline semiconductor resistor structure includes a portion that includes the second region having an elongated form extending in the first lateral direction. The semiconductor die including a third polycrystalline structure having at least a first elongated portion in a first lateral substrate direction and a fourth polycrystalline structure having at least a second elongated portion in a second lateral substate direction. The first lateral substrate direction is offset by 90 degrees from the second lateral substrate direction. The first lateral direction is laterally offset from the first lateral substrate direction by an angle in a range of 10-80 degrees and is laterally offset from the second lateral substrate direction by an angle in a range of 10-80 degrees.

In another embodiment, a semiconductor die includes a resistive element including one of more polycrystalline semiconductor resistor structures coupled together to provide a resistance path between a first terminal and a second terminal. The one or more polycrystalline semiconductor resistor structures include one or more regions each including an unsilicided portion having a net N type dopant concentration located in the resistance path and one or more regions each having an unsilicided portion having a net P type dopant concentration located in the resistance path. A ratio of a total volume of the one or more unsilicided portions of the one or more regions having a net N type dopant concentration to a total volume of the one or more unsilicided portions of the one or more regions having a net P type dopant concentration is in a range from 1.1:1 to 5:1.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor die comprising:
a polycrystalline semiconductor resistor structure including a resistance path between a first terminal and a second terminal, the polycrystalline semiconductor resistor structure comprising:
a first region having a net first conductivity type dopant concentration located in the resistance path;
a second region having a net second conductivity type dopant concentration located in the resistance path, the second conductivity type is opposite the first conductivity type;
a silicide structure located on both a first portion of the first region and a first portion of the second region to electrically connect the first portion of the first region and the first portion of the second region;
wherein the first region includes a second portion that is not silicided and the second region includes a second portion that is not silicided;
wherein the silicide structure is located at the first terminal of the polycrystalline resistive structure.

2. The semiconductor die of claim 1 wherein the second portion of the first region has a silicide blocking material located on it and the second portion of the second region has a silicide blocking material located on it.

3. The semiconductor die of claim 1 wherein the silicide structure does not have a contact structure in electrical contact with it.

4. The semiconductor die of claim 1 wherein the first region and the second region abut each other.

5. The semiconductor die of claim 1 wherein the first region and the second region are located in series with each other in the resistance path.

6. A semiconductor die comprising:
a polycrystalline semiconductor resistor structure including a resistance path between a first terminal and a second terminal, the polycrystalline semiconductor resistor structure comprising:
a first region having a net first conductivity type dopant concentration located in the resistance path;
a second region having a net second conductivity type dopant concentration located in the resistance path, the second conductivity type is opposite the first conductivity type;
a silicide structure located on both a first portion of the first region and a first portion of the second region to electrically connect the first portion of the first region and the first portion of the second region;

wherein the first region includes a second portion that is not silicided and the second region includes a second portion that is not silicided;

wherein the first region and the second region are located in parallel with each other in the resistance path.

7. A semiconductor die comprising:
a resistive element including one of more polycrystalline semiconductor resistor structures coupled together to provide a resistance path between a first terminal and a second terminal, the one or more polycrystalline semiconductor resistor structures comprising:
one or more regions each including an unsilicided portion having a net N type dopant concentration located in the resistance path;
one or more regions each having an unsilicided portion having a net P type dopant concentration located in the resistance path;
wherein a ratio of a total volume of the one or more unsilicided portions of the one or more regions having a net N type dopant concentration to a total volume of the one or more unsilicided portions of the one or more regions having a net P type dopant concentration is in a range from 1.1:1 to 5:1.

8. A semiconductor die comprising:
a polycrystalline semiconductor resistor structure including a resistance path between a first terminal and a second terminal, the polycrystalline semiconductor resistor structure comprising:
a first region having a net first conductivity type dopant concentration located in the resistance path;
a second region having a net second conductivity type dopant concentration located in the resistance path, the second conductivity type is opposite the first conductivity type;
a silicide structure located on both a first portion of the first region and a first portion of the second region to electrically connect the first portion of the first region and the first portion of the second region;
wherein the first region includes a second portion that is not silicided and the second region includes a second portion that is not silicided;
wherein the silicide structure has a contact structure in electrical contact with the silicide structure.

9. The semiconductor die of claim 1 wherein the polycrystalline semiconductor resistor structure includes a third region having a net first conductivity type dopant concentration located in the resistance path.

10. The semiconductor die of claim 9 wherein the first region, the second, and the third region are located in series with each other in the resistance path.

11. A semiconductor die comprising:
a polycrystalline semiconductor resistor structure including a resistance path between a first terminal and a second terminal, the polycrystalline semiconductor resistor structure comprising:
a first region having a net first conductivity type dopant concentration located in the resistance path;
a second region having a net second conductivity type dopant concentration located in the resistance path, the second conductivity type is opposite the first conductivity type;
a silicide structure located on both a first portion of the first region and a first portion of the second region to electrically connect the first portion of the first region and the first portion of the second region;
wherein the first region includes a second portion that is not silicided and the second region includes a second portion that is not silicided;
wherein the polycrystalline semiconductor resistor structure includes a third region having a net first conductivity type dopant concentration located in the resistance path;
wherein the first region, the second region, and the third region are located in parallel in the resistance path.

12. The semiconductor die of claim 9 wherein the second region and the third region are electrically connected to each other by a silicide structure located on a portion of the second region and a portion of the third region.

13. The semiconductor die of claim 12 wherein the silicide structure located on a portion of the second region and a portion of the third region does not have a contact structure in electrical contact with it.

14. A semiconductor die comprising:
a polycrystalline semiconductor resistor structure including a resistance path between a first terminal and a second terminal, the polycrystalline semiconductor resistor structure comprising:
a first region having a net first conductivity type dopant concentration located in the resistance path;
a second region having a net second conductivity type dopant concentration located in the resistance path, the second conductivity type is opposite the first conductivity type;
a silicide structure located on both a first portion of the first region and a first portion of the second region to electrically connect the first portion of the first region and the first portion of the second region;
wherein the first region includes a second portion that is not silicided and the second region includes a second portion that is not silicided;
wherein the polycrystalline semiconductor resistor structure includes a third region having a net first conductivity type dopant concentration located in the resistance path;
wherein the second region and the third region are electrically connected to each other by a silicide structure located on a portion of the second region and a portion of the third region;
wherein the silicide structure located on a portion of the second region and a portion of the third region is the silicide structure located on both a first portion of the first region and a first portion of the second region.

15. The semiconductor die of claim 1 further comprising:
a second polycrystalline semiconductor resistor structure including a resistance path of between a first terminal and a second terminal of the second polycrystalline semiconductor resistor structure;
wherein the polycrystalline semiconductor resistor structure includes a portion having an elongated form extending in a first lateral direction;
wherein the second polycrystalline semiconductor resistor structure includes a portion having an elongated form extending in the first lateral direction and is located in a parallel orientation with the polycrystalline semiconductor resistor structure;
wherein the first terminal of the polycrystalline semiconductor resistor structure is electrically coupled to the second terminal of the second polycrystalline semiconductor resistor structure.

16. A semiconductor die comprising:
a polycrystalline semiconductor resistor structure including a resistance path between a first terminal and a second terminal, the polycrystalline semiconductor resistor structure comprising:
  a first region having a net first conductivity type dopant concentration located in the resistance path;
  a second region having a net second conductivity type dopant concentration located in the resistance path, the second conductivity type is opposite the first conductivity type;
  a silicide structure located on both a first portion of the first region and a first portion of the second region to electrically connect the first portion of the first region and the first portion of the second region;
  wherein the first region includes a second portion that is not silicided and the second region includes a second portion that is not silicided;
  a second polycrystalline semiconductor resistor structure including a resistance path of between a first terminal and a second terminal of the second polycrystalline semiconductor resistor structure;
  wherein the polycrystalline semiconductor resistor structure includes a portion having an elongated form extending in a first lateral direction;
  wherein the second polycrystalline semiconductor resistor structure includes a portion having an elongated form extending in the first lateral direction and is located in a parallel orientation with the polycrystalline semiconductor resistor structure;
  wherein the first terminal of the polycrystalline semiconductor resistor structure is electrically coupled to the second terminal of the second polycrystalline semiconductor resistor structure;
  a first polycrystalline structure having at least a first elongated portion in a first lateral substrate direction;
  a second polycrystalline structure having at least a second elongated portion in a second lateral substrate direction, wherein the first lateral substrate direction is laterally offset by 90 degrees from the second lateral substrate direction;
  wherein the first lateral direction is laterally offset from the first lateral substrate direction by an angle in a range of 10 to 80 degrees and is laterally offset from the second lateral substrate direction by an angle in a range of 10 to 80 degrees.

17. The semiconductor die of claim 15 further comprising:
  a silicide blocking material structure extending over a portion of the polycrystalline semiconductor resistor structure and a portion of the second polycrystalline semiconductor resistor structure.

18. A semiconductor die comprising:
  a first polycrystalline semiconductor resistor structure including a resistance path between a first terminal and a second terminal, the first polycrystalline semiconductor resistor structure comprising:
    a first region having a net first conductivity type dopant concentration located in the resistance path;
    wherein the first polycrystalline semiconductor resistor structure includes a portion that includes the first region having an elongated form extending in a first lateral direction;
  a second polycrystalline semiconductor resistor structure including a resistance path of between a first terminal and a second terminal of the second polycrystalline semiconductor resistor structure, the second polycrystalline semiconductor resistor structure comprising:
    a second region having a net second conductivity type dopant concentration located in resistance path, the second conductivity type is opposite the first conductivity type;
    wherein the second polycrystalline semiconductor resistor structure includes a portion that includes the second region having an elongated form extending in the first lateral direction;
  a third poly crystalline structure having at least a first elongated portion in a first lateral substrate direction;
  a fourth polycrystalline structure having at least a second elongated portion in a second lateral substrate direction, wherein the first lateral substrate direction is offset by 90 degrees from the second lateral substrate direction;
  wherein the first lateral direction is laterally offset from the first lateral substrate direction by an angle in a range of 10-80 degrees and is laterally offset from the second lateral substrate direction by an angle in a range of 10-80 degrees.

19. The semiconductor die of claim 18 wherein:
  the first polycrystalline semiconductor resistor structure includes a second region having a net second conductivity type dopant concentration located in the resistance path;
  the second polycrystalline semiconductor resistor structure includes a second region having a net first conductivity type dopant concentration located in the resistance path.

20. The semiconductor die of claim 7 wherein the silicide structure is located at the first terminal of the polycrystalline resistive structure.

* * * * *